US010177688B2

(12) United States Patent
Park et al.

(10) Patent No.: US 10,177,688 B2
(45) Date of Patent: Jan. 8, 2019

(54) FLOATING OFF-SHORE POWER GENERATION APPARATUS USING IONIC POLYMERIC METAL COMPOSITE

(71) Applicant: IN-JE UNIV. INDUSTRY-ACADEMIC COOPERATION FOUNDATION, Gimhae-si, Gyeongsangnam-do (KR)

(72) Inventors: Ki-won Park, Busan (KR); Hyung-man Kim, Busan (KR); Jung-koo Lee, Nonsan-si (KR); Ji-woong Ahn, Gimhae-si (KR); Kyung-cheol Kim, Busan (KR)

(73) Assignee: IN-JE UNIVERSITY INDUSTRY-ACADEMIC COOPERATION FOUNDATION (KR)

( * ) Notice: Subject to any disclaimer, the term of this patent is extended or adjusted under 35 U.S.C. 154(b) by 565 days.

(21) Appl. No.: 14/840,179

(22) Filed: Aug. 31, 2015

(65) Prior Publication Data
US 2015/0372619 A1    Dec. 24, 2015

Related U.S. Application Data

(63) Continuation of application No. PCT/KR2013/006805, filed on Jul. 30, 2013.

(30) Foreign Application Priority Data

Mar. 26, 2013    (KR) ........................ 10-2013-0032078

(51) Int. Cl.
*H01L 41/08* (2006.01)
*H02N 2/02* (2006.01)
(Continued)

(52) U.S. Cl.
CPC ............. *H02N 2/185* (2013.01); *F03B 13/14* (2013.01); *F03G 7/005* (2013.01); *H01L 41/193* (2013.01);
(Continued)

(58) Field of Classification Search
CPC ................................ H02N 2/18; H01L 41/113
(Continued)

(56) References Cited

U.S. PATENT DOCUMENTS

2009/0293664 A1    12/2009  Aabloo
2009/0315431 A1*  12/2009  Rastegar ............. H01L 41/1136
                                                      310/331
(Continued)

FOREIGN PATENT DOCUMENTS

JP      2011-106434 A      6/2011
KR  10-2006-0125435 A    12/2006
(Continued)

OTHER PUBLICATIONS

WIPO, International Search Report (PCT/KR2013/006805), dated Nov. 7, 2013.

*Primary Examiner* — J. San Martin
(74) *Attorney, Agent, or Firm* — Park & Associates IP Law, P.C.

(57) ABSTRACT

The present invention relates to a floating offshore power generation apparatus using an ionic polymer-metal composite, including: a floating body floating on water; an ionic polymer-metal composite that is attached to the floating body and generates electricity by bending in a vertical or horizontal direction according to the flowing state of sea water; a rectification unit that converts, into a direct electric current, the electricity generated in the form of an alternating electric current in the ion polymeric metal composite; and a load unit that is connected to the rectification unit and (Continued)

supplies or stores the produced electricity. According to the present invention, ionic polymer-metal composites having hydrophilicity are attached to one floating body instead of complicated mechanical parts vulnerable to the offshore environment, thereby facilitating maintenance and increasing power generation efficiency per unit area.

5 Claims, 3 Drawing Sheets

(51) Int. Cl.
    *H02N 2/18*     (2006.01)
    *F03B 13/14*     (2006.01)
    *H02N 11/00*     (2006.01)
    *F03G 7/00*     (2006.01)
    *H01L 41/193*     (2006.01)

(52) U.S. Cl.
    CPC ...... *H02N 11/002* (2013.01); *F05B 2220/709* (2013.01); *Y02E 10/38* (2013.01)

(58) Field of Classification Search
    USPC .......................................................... 310/339
    See application file for complete search history.

(56) References Cited

U.S. PATENT DOCUMENTS

| | | | | |
|---|---|---|---|---|
| 2010/0019498 A1* | 1/2010 | Pollack | ................ | F03B 13/188 290/53 |
| 2011/0018396 A1* | 1/2011 | Hayamizu | .............. | A01K 85/01 310/339 |
| 2011/0241490 A1 | 10/2011 | Anand | | |
| 2012/0056432 A1* | 3/2012 | Nair | .................... | F03B 13/1885 290/53 |
| 2013/0307278 A1* | 11/2013 | Coonrod | .................. | F03G 7/08 290/1 R |
| 2014/0145550 A1* | 5/2014 | Hitchcock | ............ | H01L 41/113 310/300 |
| 2015/0285212 A1* | 10/2015 | Wu | ........................ | F03B 13/20 310/339 |

FOREIGN PATENT DOCUMENTS

| | | |
|---|---|---|
| KR | 10-2009-0082527 A | 7/2009 |
| KR | 10-1071644 B1 | 10/2011 |
| KR | 10-1178482 B1 | 9/2012 |

* cited by examiner

FLOATING OFF-SHORE POWER GENERATION APPARATUS USING IONIC POLYMERIC METAL COMPOSITE

REFERENCE TO RELATED APPLICATIONS

This is a continuation of pending International Patent Application PCT/KR2013/006805 filed on Jul. 30, 2013, which designates the United States and claims priority of Korean Patent Application No. 10-2013-0032078 filed on Mar. 26, 2013, the entire contents of which are incorporated herein by reference.

FIELD OF THE INVENTION

The present invention relates to a floating offshore power generation apparatus using an ionic polymer-metal composite. More particularly the present invention relates to a floating offshore power generation apparatus that can increase power generation efficiency per unit area by using a plurality of ionic polymer-metal composites attached to a floating body in the form of a structure that is suitably used for offshore power generation.

BACKGROUND OF THE INVENTION

Generally, representative methods to produce electricity include a thermal power generation method that uses fossil fuel as an energy source and a nuclear power generation method that uses nuclear fission.

However, thermal power generation has disadvantages of immense construction cost and environmental pollution attributable to combustion of fossil fuel. On the other hand, nuclear power generation is advantageous in terms of mass production of electricity but it poses many problems, including: immense cost for construction of facilities that can prevent leaking of radiation, strong resistance by local residents against construction of a new nuclear power plant because a nuclear power plant is recognized as an unpleasant facility, difficulties in treating radiative waste, and risk of destruction of the environment from even a minor accident.

Recently, attention has been made to using natural energy sources such as wind power, tidal power, hydroelectric power, or solar energy as an alternative energy to fossil fuel because they are clean energies that are free from risk of causing environmental pollution and are perpetual energy sources that are free from risk of exhaustion.

A hydroelectric power plant, which is the most commonly used type of power plant, does not directly cause environmental pollution. However, immense cost is incurred for construction of a dam, and dams may cause secondary environmental problems such as change of an ecosystem because a large area is submerged after construction of a dam. Further, large sized dames may even produce local weather changes.

On the other hand, wind power generation and solar energy generation have a problem of being dependent on weather conditions. That is, when there is no wind or sunlight, power generation is impossible.

Power generation technologies using clean energy have been developed. Therefore, various power generation methods using inexhaustible natural energy sources have been developed and become widely used. For example, there are many forms of power generation using energy sources obtained from the oceans, including sunlight, tidal current, temperature differences, wave power, tides, wind power, etc.

These power generation methods have an advantage of using clean energy which is free from risk of causing environmental pollution. However, these methods also have disadvantages. For example, tidal power generation is limitedly used due to geographical requirements. Therefore, it is difficult to apply tidal power generation universally. Furthermore, tidal power generation has problems of immense construction cost, devastation of foreshore, and negative influence on the environment of vast areas. Wave power generation and ocean thermal energy conversion (OTEC) also cannot be used universally because they can only be used in very limited locations.

Tidal current generation is given prominence as an alternative power generation method because it uses clean energy and due to the fact that it can perform continuous power generation regardless of weather conditions in an ocean environment. Tidal current generation is also limitedly used due to geographical location requirements but can be more broadly used than tidal power generation. Consequently, tidal current generation has been paid attention due to the fact that it actively uses kinetic energy of a tidal stream. However, it also has problems of installation of complex facilities and limited power generation capacity.

In order to solve the above problems, Korean Patent No. 10-1178482 discloses a "floating offshore combined power generation system."

The floating offshore combined power generation system includes a floating body that floats on water, a photovoltaic power generator that is installed on the floating body and produces electricity using sunlight, a wave energy converter that is installed on the side of the floating body and produces electricity using the power of waves, a wind power generator that is installed on the floating body and produces electricity using the power of wind, and a tidal current generator that produces electricity using a tidal current that flows under the floating body. The floating offshore combined power generation system further includes a complex power management device that is electrically connected to the photovoltaic power generator, the wave energy converter, the wind power generator, and the tidal current generator to combine electrical energies generated by the power generators and controls the frequency and amplitude of the electrical energies generated by the power generators. The complex power management device includes a power controller that is electrically connected to the photovoltaic power generator, the wave energy converter, the wind power generator, and the tidal current generator and that controls the frequency and amplitude of electrical energies generated by the power generators by controlling the frequency and amplitude of an electric current generated by each power generator, a filter that eliminates a noise component in the electricity that is output from the power controller, and an interconnection controller that is connected to the filter and blocks an inverse voltage and a reverse current. The complex power management device combines electricity generated by each power generator into a single electric power source and supplies it as a commercial power source. The floating offshore combined power generation system is composed of a plurality of sectors that is electrically connected to each other. The floating offshore combined power generation system is controlled by an integrated management-and-control station that collectively controls electricity generated by each sector. The integrated management-and-control station includes an energy storage device that improves the quality of electricity dependent on variations in electricity generated by two or more kinds of generators and an interconnection controller that is installed between the energy storage device and the commercial power source and blocks an inverse voltage and a reverse current.

The conventional floating offshore power generation system having the structure and operation described above can maximize power generation capacity by continuously performing power generation using clean energies including sunlight, wave power, wind power, tidal current, etc. in ocean environment.

However, since the conventional floating offshore power generation system is composed of a plurality of power generators and its peripheral apparatuses are complicated mechanical parts, a fatal breakdown may occur upon occurrence of a water leak. Furthermore, the lifespan of the mechanical parts is inevitably shortened in extreme conditions of an ocean environment. That is, it is difficult to maintain the conventional floating offshore power generation system. In addition, it has a problem of low power generation efficiency per unit area.

SUMMARY OF THE INVENTION

Accordingly, the present invention has been made keeping in mind the above problems occurring in the related art, and an object of the present invention is to provide a floating offshore power generation apparatus using an ionic polymer-metal composite that can be easily maintained on water and can increase power generation efficiency per unit area.

In order to accomplish the above objects, according to one aspect, there is provided a floating offshore power generation apparatus using an ionic polymer-metal composite, the apparatus including: a floating body having buoyancy so as to float on water; an ionic polymer-metal composite that is attached to the floating body and generates electricity by bending in a vertical or horizontal direction according to the flowing state of sea water; a rectification unit that converts electricity of an alternating current generated in the ionic polymer-metal composite into a direct current; and a load unit that that is connected to the rectification unit and stores or supplies produced electricity.

The floating body may have a ring shape, the ionic polymer-metal composite may take a film form having a predetermined length, and a plurality of the ionic polymer-metal composites may be arranged at regular intervals along a circumference of the floating body and be attached to the floating body in the form of cantilevers. In the floating offshore power generation apparatus, a plurality of the floating bodies may be stacked in a vertical direction and assembled to form a module having a cylinder shape.

The floating body may have an inner cylinder taking a hollow tube form therein, and an electrical wire that connects the plurality of the floating bodies in series and/or parallel to each other may extend through a hollow of the inner cylinder.

The ionic polymer-metal composites may be fixedly arranged in a radial direction, along the circumference of the floating body, an end of each ionic polymer-metal composite may extend inward to protrude from an inside surface of the floating body, and a remaining end of each ionic polymer-metal composite may extend outward from the floating body to protrude outside the surface of the floating body. The ionic polymer-metal composites may be arranged on the circumferential surface of the floating body and connected in parallel to each other.

According to a floating offshore power generation apparatus using an ionic polymer-metal composite according to the present invention, since it is possible to attach hydrophilic ionic polymer-metal composites to a floating body instead of using complicated mechanical parts that are vulnerable to the offshore environment, the apparatus can be easily maintained and increase power generation efficiency per unit area.

DETAILED DESCRIPTION OF THE INVENTION

Hereinafter, preferred embodiments of the present invention will be described with reference to the accompanying drawings. A description or illustration about structures, effects, and advantages that the ordinarily skilled in the art can easily appreciate is simplified or omitted but a description or illustration will be focused on parts that closely relate to the present invention.

Figure 1:
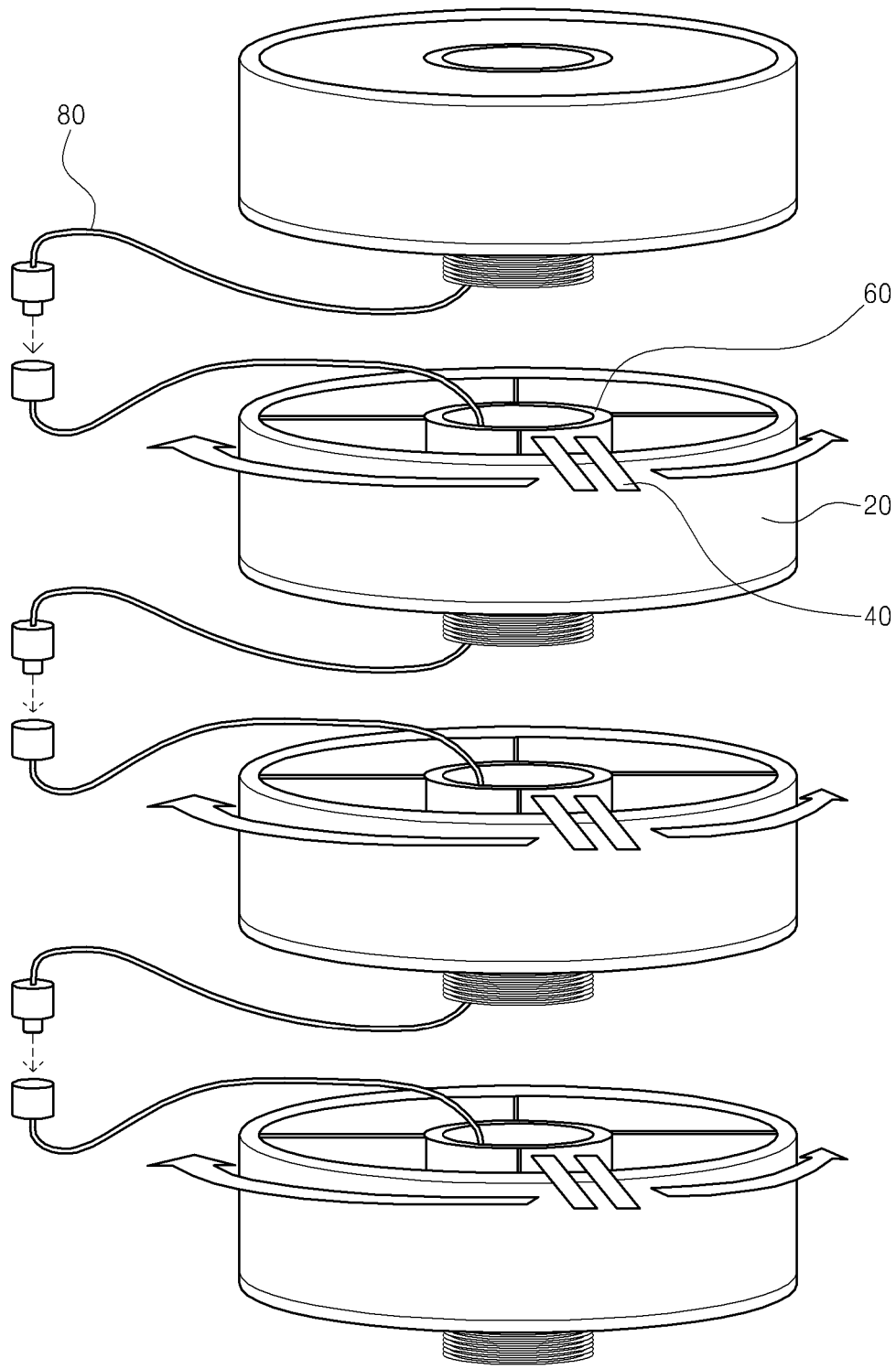
FIG. 1 is a perspective view illustrating a floating offshore power generation apparatus using an ionic polymer-metal composite according to one embodiment of the present invention.

As illustrated in FIG. 1, a floating offshore power generation apparatus using an ionic polymer-metal composite according to one embodiment of the present invention includes a floating body 20 having buoyancy so as to float on water, an ionic polymer-metal composite 40 that is attached to the floating body 20 and generates electricity by bending in a vertical or horizontal direction according to the flowing state of sea water, a rectification unit (not shown) that converts the electricity of an alternating electric current generated in the ionic polymer-metal composite 40 into a direct electric current, and a load unit (not shown) that is connected to the rectification unit and supplies or stores the produced electricity.

The floating body 20 has a ring shape and can be made of any material as long as the floating body 20 can float on water. In addition, as illustrated in FIG. 1, a plurality of the floating bodies 20 is stacked and assembled in a vertical direction, forming a module 100 having a cylinder shape. When the module 100 floats on sea water, it is vertically or horizontally arranged. The floating body 20 has an inner cylinder 60 taking a hollow tube form therein. An electric wire 80 that electrically connects a plurality of floating bodies 20 in parallel or series to each other extends through the hollow of the inner cylinder 60. The parallel connection of the floating bodies 20 increases the electric current and the series connection of the floating bodies 20 increases the electric voltage. On the other hand, the series connection and the parallel connection may be combined to increase the electrical power.

Figure 2:
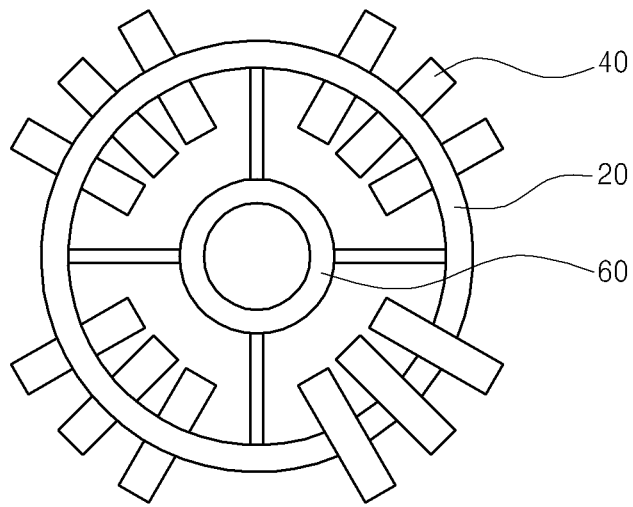
FIG. 2 is a horizontal cross-sectional view of an assembled body in which a plurality of the apparatuses of FIG. 1 is assembled in a vertical direction.

When a plurality of floating bodies 20 is assembled in a vertical direction, as illustrated in FIG. 2, an upper end of the inner cylinder is provided with internal screw threads, and a lower end of the inner cylinder is provided with external screw threads. The threaded portion of the inner cylinder 60 undergoes a sealing process for hermetic sealing of the inner cylinder 60. As long as the hollow of the inner cylinder 60 can be sealed, the inner cylinders of the floating bodies can be connected to each other in any manner, aside from the screwing manner.

The ionic polymer-metal composite 40 may be a metal composite based on an ionic polymer among electro active polymers (EAPs). Specifically, the ionic polymer-metal composite is a material in which ions in a polymeric thin film move when external force is applied thereto, producing electricity. The ionic polymer-metal composite 40 has a characteristic of producing electricity even when physical stimulation of a low frequency band is applied, unlike a conventional piezoelectric element. Therefore, it is suitably used on sea water which continuously flows. Specifically, since the ionic polymer-metal composite 40 is a hydrophilic metal, electricity can be produced even under water. Therefore, the ionic polymer-metal composite 40 can be used in offshore environment and can be easily maintained.

Figure 3:
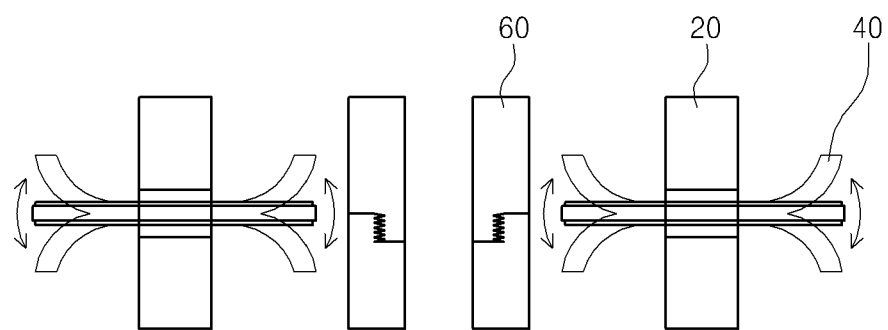
FIG. 3 is a plan view illustrating an assembled body in which a plurality of apparatuses of FIG. 1 is assembled in a vertical direction.

The ionic polymer-metal composite 40 according to the embodiment of the present invention takes the form of a film having a predetermined length. A plurality of ionic polymer-metal composites 40 is fixed in the form of cantilevers to the circumferential surface of the floating body 20 and is arranged at regular intervals along the circumference of the floating body 20. As illustrated in FIG. 3, the ionic polymer-metal composites 40 are fixedly arranged in a radial direction along the circumference of the floating body 20. An end of the ionic polymer-metal composite 40 protrudes from the inside surface of the floating body 20 and the remaining end of the ionic polymer-metal composite 40 protrudes from the outside surface of the floating body 20. Accordingly, as illustrated in FIG. 2, respective ends of the ionic polymer-metal composite 40 can bend when they come into contact with sea water. Therefore, compared with a cantilever structure in which only one end protrudes from an outside surface of a floating body, the ionic polymer-metal composites 40 can receive more frequent physical stimulation. Since the ionic polymer-metal composites 40 are connected in parallel with each other while they are arranged along the circumference of the floating body 20, it is possible to increase the amount of an electric current.

Although not illustrated in the drawings, pendulums may be attached to the respective ends of the ionic polymer-metal composite 40 to increase the range of bending motion of the ionic polymer-metal composite 40. The pendulums increase the range of the bending motion of the ionic polymer-metal composite 40 having a cantilever structure in a vertical direction, thereby increasing electricity generation efficiency.

Figure 4:
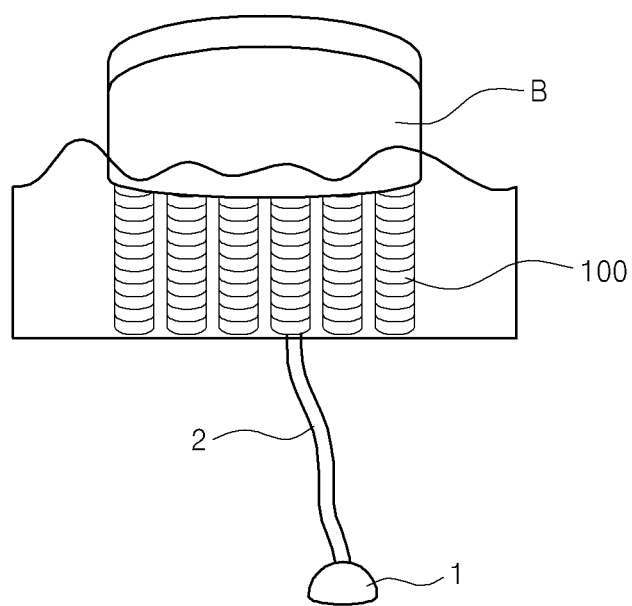
FIG. 4 is a schematic view illustrating a state in which a module including a plurality of floating bodies of FIG. 1 is accommodated in a buoy.

FIG. 4 is a schematic view illustrating a state in which a cylindrical module 100 in which a plurality of floating bodies 20 is assembled is accommodated in a buoy B. The buoy is a floating device (sea mark) that is installed in a predetermined position on the surface of a water body. The buoy is connected to a chain or rope 2 and anchored to the bed of a water body using an anchor or a sinker 1. The module 100 is mounted in the buoy, thereby serving as a floating power generation apparatus.

In the embodiment shown in FIG. 4, the module 100 floats on the surface of water and is arranged in a vertical direction. The ionic polymer-metal composites 40 are partially attached to the floating body 20 bend up and down along movement of waves, thereby producing electricity.

Although not illustrated in the drawings, according to another embodiment, the module may be installed in a horizontal direction when it is accommodated in the buoy. In this case, the ionic polymer-metal composites may produce electricity by bending in the horizontal direction due to tidal force.

According to the present invention which has been described so far, since the ionic polymer-metal composites can be attached to one floating body instead of complicated mechanical parts that are vulnerable to the offshore environment, it is possible to facilitate maintenance and increase efficiency of production of electricity per unit area.

Features and technical advantages of the present invention have been broadly described to help the scope of the present invention that is disclosed in the accompanying claims be well understood. Further, although preferred embodiments of the present invention have been described for illustrative purposes, those skilled in the art will appreciate that various modifications, additions and substitutions are possible, without departing from the scope and spirit of the invention as disclosed in the accompanying claims. Furthermore, various changes and modifications of the present invention made within the technical sprit of the present invention are appreciated as included in the scope of the claims of the invention defined by the accompanying claims.

The present invention relates to a floating offshore power generation apparatus using an ionic polymer-metal composite. More particularly, the present invention can be used in the field of production of floating offshore power generation apparatuses in which a plurality of ionic polymer-metal composites is attached to a floating body to form a structure that is suitable for offshore power generation.

What is claimed is:

1. A floating offshore power generation apparatus using an ionic polymer-metal composite, comprising:
   a floating body floating on water;
   an ionic polymer-metal composite attached to the floating body and generating electricity when bending by the flow of ambient water on which the floating body floats;
   a rectification unit for converting electricity of an alternating current generated by the ionic polymer-metal composite into a direct current; and
   a load unit connected to the rectification unit and for storing or supplying the electricity produced,
   wherein the floating body has a ring shape, and the ionic polymer-metal composite is in the form of a plurality of the ionic polymer-metal composites, each having a cantilever shape, and arranged at regular intervals along a circumference of the floating body.

2. The floating offshore power generation apparatus according to claim 1, wherein the floating body is in the form of a plurality of the floating bodies that are stacked in a vertical direction to form a module having a cylinder shape.

3. The floating offshore power generation apparatus according to claim 2, wherein each of the floating bodies has an inner cylinder disposed in the floating body, and an electrical wire is received in the inner cylinders and connected to the plurality of the floating bodies.

4. The floating offshore power generation apparatus according to claim 1, wherein the ionic polymer-metal composites are arranged in a radial direction and fixed to the floating body, with an end of each ionic polymer-metal composites extending inward from an inside surface of the floating body, and an opposite end of each ionic polymer-metal composites extending outward to protrude from an outside surface of the floating body.

5. The floating offshore power generation apparatus according to claim 4, wherein the ionic polymer-metal composites are arranged on the circumferential surface of the floating body in parallel relation to one another.

* * * * *